United States Patent [19]

Gappa et al.

[11] 4,247,826
[45] Jan. 27, 1981

[54] SEMICONDUCTOR INTEGRATED AMPLIFIER

[75] Inventors: Takeshi Gappa, Hino; Osamu Yamashiro, Ohmiya, both of Japan

[73] Assignee: Hitachi, Ltd., Japan

[21] Appl. No.: 902,852

[22] Filed: May 4, 1978

[30] Foreign Application Priority Data

May 13, 1977 [JP] Japan .................. 52-54282

[51] Int. Cl.² .................. H03F 3/185; H03F 3/187
[52] U.S. Cl. .................. 330/264; 330/307
[58] Field of Search .................. 330/277, 264, 307; 357/14, 42, 51

[56] References Cited

U.S. PATENT DOCUMENTS

| 3,886,458 | 5/1975 | Matsumoto et al. | 357/14 X |
| 4,100,502 | 7/1978 | Yamashiro | 330/264 |

Primary Examiner—James B. Mullins
Attorney, Agent, or Firm—Craig & Antonelli

[57] ABSTRACT

A semiconductor integrated amplifier having a p-channel type MISFET and an n-channel type MISFET which are integrated in a single semiconductor substrate, a load resistance connected between the drain regions of the MISFETs, a power source to which the MISFETs are connected in series, and a DC current blocking capacitor through which the gates of the MISFETs are connected to each other. The amplifier has a gate capacitance one terminal of which is constituted by a well formed in the substrate and connected to high voltage side of power supply, while the other electrode thereof is constituted by a gate electrode formed on the well and connected to the low voltage side of the power supply. Parasitic capacitance of the capacitor is considerably reduced to allow a wider range of frequency adjustment of the amplifier.

9 Claims, 14 Drawing Figures

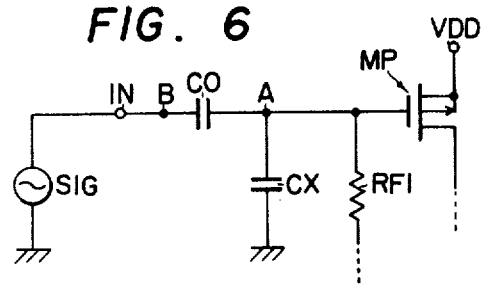
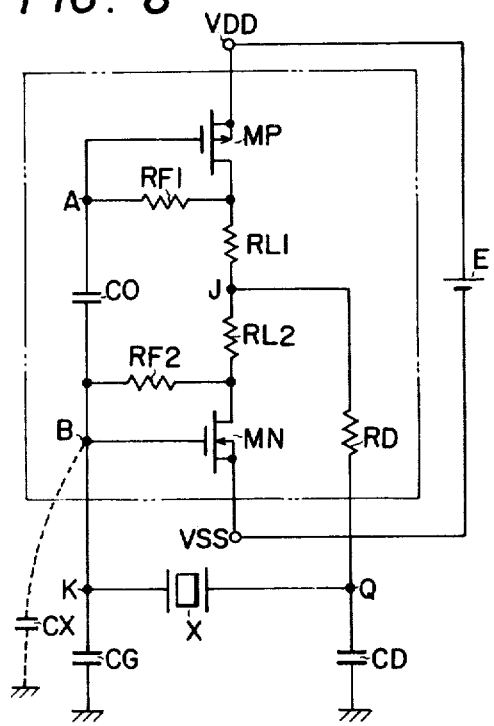
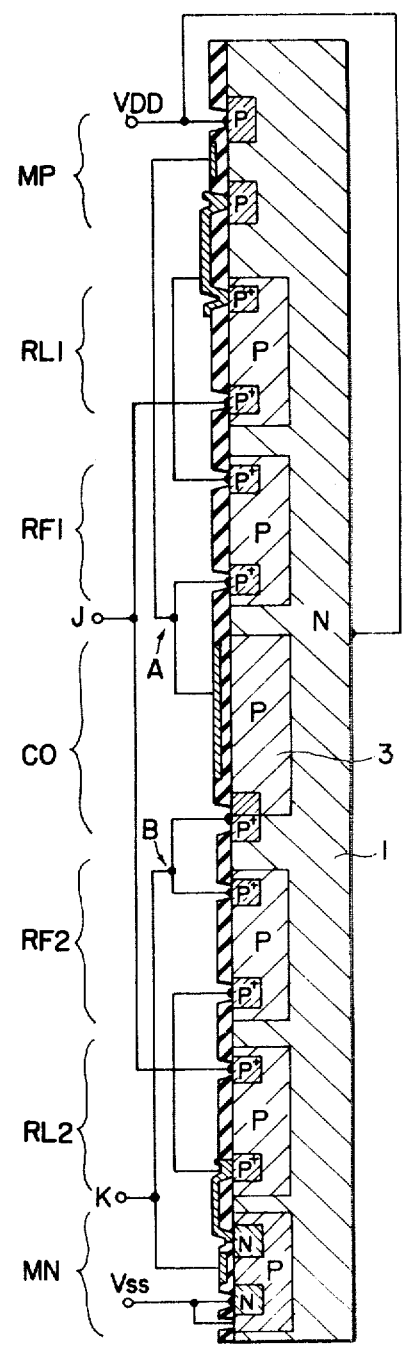

SEMICONDUCTOR INTEGRATED AMPLIFIER

BACKGROUND OF THE INVENTION

The present invention relates to a semiconductor integrated amplifier circuit integrated in a single semiconductor substrate and, more particularly, to an amplifier circuit and an oscillation circuit making use of CMOS (Complementary MOS).

Such an oscillation circuit has been known as having a CMOS amplifier circuit incorporating a p-channel MISFET and an n-channel MISFET are connected in series, so as to perform a complementary operation upon common application of an input signal to the gates of both MISFETs.

A power-saving CMOS amplifier circuit as shown in FIG. 1 has been proposed by Osamu Yamashiro, one of the present inventors, in U.S. Patent Application Ser. No. 719,238 now U.S. Pat. No. 4,100,502, issued July 11, 1978 and herein incorporated by reference. In this CMOS amplifier circuit, as shown in FIG. 1, a p-channel FETMP provided at the side of one power source terminal VDD and an n-channel FETMN provided at the side of the other power source terminal VSS are connected to each other through a load resistance RL. At the same time, bias resistances RF1 and RF2 are connected between the gates and drains of a respective one of the FETMP and FETMN. Further, a capacitor CO for blocking DC current is connected between the gates of both FETs.

In this amplifier circuit, since the inverter constituted by complementary MOSFET is provided with the load resistance RL, it is possible to make the input/output transmission characteristic steep enough, by selecting the resistance value of the load resistance larger than the resistance between the source and drain of each of the insulated gate type field effect transistor MP, MN. At the same time, by doing so, the bias voltage between the gate and the source comes close to its threshold, so that the power consumption is considerably decreased.

In addition, the bias resistances RF1 and RF2 connected between the gate and the drain of respective FETs (FETMP and FETMN) function to bias the potentials of respective gates to a level substantially equal to the DC potential of respective drains. The biasing point is more stabilized, and a higher mu-factor is maintained, as the values of the resistances becomes smaller. This amplifier circuit makes the most of these phenomena.

Further, in the above stated circuit, the DC component of the input signal applied to the terminal IN is cut by the DC blocking capacitor CO, so that the bias points of FETMP and FETMN are determined independently, without being affected by each other.

Consequently, an amplification circuit having a high stability and capable of greatly saving the power is obtained.

By the way, it is preferable that the electronic devices consisting of various circuits have a reduced number of parts. To cope with this demand, the present inventors have made various studies and attempts to obtain an amplifier of so-called semiconductor integrated circuit device type, in which the amplifier is composed in a single semiconductor substrate. As a result of these studies, the inventors have confirmed that the resistances RL, RF1 and RF2 can be made integral with other P and N type MOSFETs in a single semiconductor chip, by making use of resistors separated by PN junctions from the semiconductor substrate, the resistors consisting of a polysilicon body or FET resistors consisting of the resistance produced between the source and drain of a MOSFET when a fixed voltage is applied to the MOSFET.

The inventors have further attempted to integrate the DC current blocking capacitor CO in the above stated circuit. The first attempt was to obtain the integrated capacitor CO from a so-called MIS capacitor having a first electrode constituted by a semiconductive region on the surface of a semiconductor substrate and a second electrode constituted by a conductive layer formed on the semiconductive region with an insulating film disposed therebetween. However, this arrangement has proven to have a disadvantage in that the function of the amplifier circuit is adversely affected seriously by a so-called parasitic capacitance CX caused by a PN junction between the semiconductive region forming one of the electrodes of the MIS capacitor and the substrate of an opposite conductive type to the semiconductive region. Namely, the signal transfer characteristics of the amplifier is largely affected by the position at which the parasitic capacitance is disposed equivalently, in connection with the input terminal to which the input signal is delivered.

Further, in a quartz oscillator or the like device making use of this type of amplifier, when a parasitic capacitance of a capacitance value matching that of a capacitor, which is connected externally of the IC for the purpose of adjustment of the oscillation frequency, is provided in the positive feedback circuit, the adjustable range of the frequency is largely narrowed due to the presence of the parasitic capacitance CX.

Especially, in such electronic devices as electronic timepieces which requires not only a reduced power consumption but also a highly precise circuit operation, the above stated defect causes a fatal problem which would hinder or limit the future incorporation of such an integrated circuit in these devices.

SUMMARY OF THE INVENTION

The present invention has been achieved to overcome the above stated problems of the prior art, and to cope with the various demands which have not been fully met by prior art devices.

It is therefore an object of the invention to provide a novel semiconductor integrated amplifier circuit device.

It is another object of the invention to provide a semiconductor integrated amplifier circuit device in which the influence of the parasitic capacitance of a capacitor built in a single semiconductive substrate is reduced as much as possible.

It is still another object of the invention to provide an improved CMOS oscillation circuit dev..e.

It is a further object of the invention to provide a CMOS amplifier circuit or oscillation circuit of a reduced power consumption and the influence of the parasitic capacitance of a DC current blocking capacitor is reduced as much as possible.

It is a still further object of the invention to provide a capacitor built in a single semiconductor substrate and having a small parasitic capacitance.

These and other objects, as well as advantageous features of the invention will become more clear from the following description of the preferred embodiments taken in conjunction with the accompanying drawings in which:

BRIEF DESCRIPTION OF THE DRAWINGS

FIG. 8 is a circuit diagram of a quartz oscillator incorporating the semiconductor integrated circuit device in accordance with the invention, FIG. 9 is a sectional view of an essential part of the semiconductor integrated circuit device as incorporated in the quartz oscillator as shown in FIG. 8, FIGS. 10, 11, 13 and 14 are sectional views of essential parts of different capacitors which can be used in the circuit device in accordance with the invention.

DESCRIPTION OF THE PREFERRED EMBODIMENTS

Figure 1:
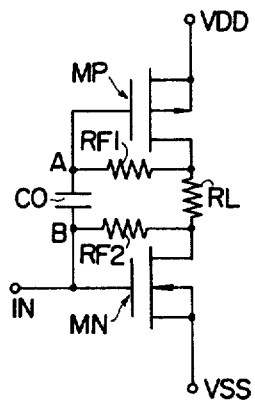
FIG. 1 is a circuit diagram for explaining a CMOS amplifier circuit used in the present invention.
Figure 2:
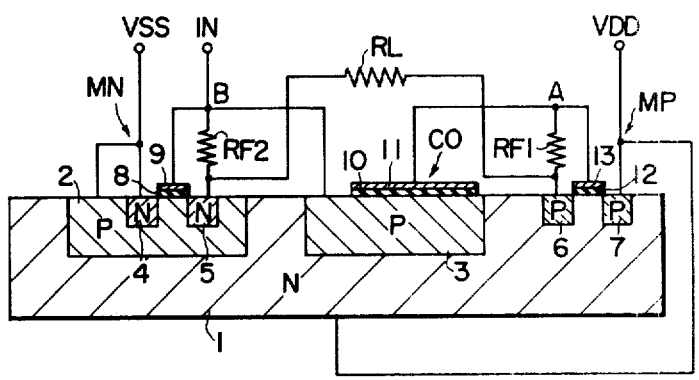
FIG. 2 is a sectional view of an essential part of a semiconductor integrated circuit device embodying the invention, composed by mounting the circuit as shown in FIG. 1 in a single semiconductor substrate.

Referring to FIG. 2 showing a sectional view of an essential part of a semiconductor circuit device in which the amplifier circuit of the first embodiment as shown in FIG. 1 is built in a single semiconductor substrate, P type semiconductor regions (referred to as P type well or wells, hereinafter) 2, 3 are formed in the major surface of an N type silicon unicrystal substrate 1. N type source and drain regions 4, 5 are formed on the surface of the P type well 2. At the same time, a gate electrode 9 consisting of a metal such as aluminum or a polysilicon is formed on the surface of the P type well 2, through a gate insulating film 8 interposed therebetween. The gate insulating film 8 is made of an insulating material such as silicon oxides and has a thickness of about 100 Å. These source and drain regions 4, 5 and the gate electrode 9 in combination constitute a MOSFET MN.

Turning now to the other P type well 3, an insulating film 10 of 100 Å thick and made of an insulating material such as a silicon oxide is formed on the surface thereof. At the same time, a conductive layer 11 made of a metal such as aluminum or a polysilicon is formed on the insulating layer 10, so as to form a capacitor CO.

In addition, a p-channel type MOSFET MP is formed by P type source and drain semiconductive regions 6, 7 formed on the other major surface of the N type substrate 1 and by a gate electrode formed with aluminum or the like metal or a polysilicon on the same major surface through an insulating layer 12 of 100 Å thick and made of silicon oxides or the like insulating material.

In FIG. 2, symbols RL, RF1 and RF2 denote resistances. These resistances can be formed in integration with the above stated transistors MN and MP and with the capacitor CO, in the form of, as mentioned before, semiconductive resistors formed on the surface of the semiconductive substrate 1, polysilicon resistors formed on an insulating film or in the form of channel resistances of MOSFETs. However, for the clarification of the drawing and easier understanding of the invention, these resistances are not shown in cross section but are simply represented by these symbols.

As will be seen from FIG. 2, in the integrated circuit device in accordance with the first embodiment of the invention, the semiconductive region (P well) constituting the first electrode of a capacitor CO is separated from the substrate 1 by means of a PN junction, and is connected to the gate electrode 9 of the MOSFET MN formed on the surface of the other P well 2, through a wiring layer.

On the other hand, the conductive layer 11, which constitutes the second electrode of the capacitor CO, is connected through the wiring layer to the gate electrode 13 of the MOSFET MP which is formed directly, i.e. without the medium of the well, on the N type substrate.

By mounting the amplifier circuit as shown in FIG. 1 in a single semiconductor substrate in the described manner, the amplifier is rendered more free from the influence of the parasitic capacitance CX of the capacitor CO existing between the capacitor CO and the substrate.

Figure 5:
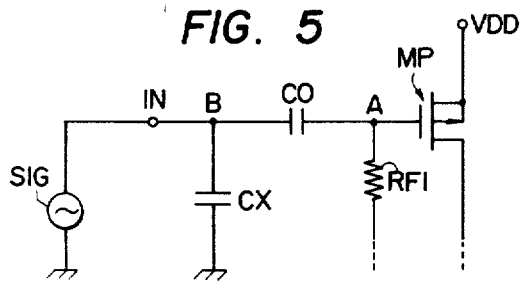

Namely, referring to FIG. 5 which shows an equivalent circuit to the integrated circuit device as shown in FIG. 2, the parasitic capacitance CX is directly connected between the input terminal IN of the amplifier and GND, in parallel with the internal capacitance possessed by the input signal source SIG, so that most of the component of the signal delivered to the input terminal IN is transmitted to the gate electrode of the MOSFET MP.

Figure 7:
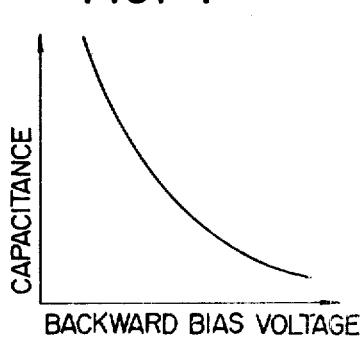
FIG. 7 shows a characteristic curve of a parasitic capacitance of a capacitor as used in the present invention.

FIG. 7 shows the relationship between the backward bias voltage and capacitance in the PN junction formed in the semiconductor substrate. It will be seen that the parasitic capacitance CX between the substrate 1 and the P type well gets smaller, as the backward bias voltage between the substrate 1 and the P type well 3 becomes high. By mounting the elements in a single substrate and suitably connecting them as shown in FIG. 2, the gate point B of FETMN of a potential lower than that of the gate point A of FETMP at the plus power source side VDD is connected to the P type well 3, so that a relatively high backward voltage is applied between the P type well 3 and the N type substrate 1. Consequently, the parasitic capacitance CX residing between the P type well 3 and the substrate 1 is conveniently made smaller. For information, when an electronic device is loaded with this circuit, either one of the power source terminals VDD and VSS as shown in FIGS. 1 and 2 is grounded.

On the other hand, provided that the P type well constituting the capacitor CO is connected to the point A, while the electrode 11 on the P type well is connected to the point B, so as to integrate the circuit as shown in FIG. 1, the circuit becomes equivalent to that as shown in FIG. 6. In this case, the parasitic capacitance CX is inserted between the capacitor CO and the gate of the MOSFET MP which are connected in series to the input terminal IN, so that the signal voltage delivered from the input signal source SIG is divided by CO and CX and applied to MOSFET MP. At the same time, since the point A whose potential is higher than that of the point B is connected to the P type well 3, the backward bias voltage applied across the PN junction formed between the P type well 3 and the N type substrate becomes relatively small, so that the capacitor CO comes to have a larger parasitic capacitance, as compared with that of CO of FIG. 2.

From the foregoing description, it will be seen that an amplifier which is less affected by the parasitic capacitance CX is achieved by the semiconductor integrated circuit device as shown in FIG. 2.

In case a further improvement of the characteristics of the amplifier is required through enlarging the capacitance of the capacitor CO, it is necessary to make the area of the electrode 11 on the P type well 3 correspondingly large. This means that the area of the P type well 3 itself has to be inconveniently large. The IC structure as shown in FIG. 2 can conveniently cope with this demand, because it affords mounting the capacitor CO having larger capacitance and with a smaller parasitic capacitance, for a given limited area of the P type well.

Figure 3:
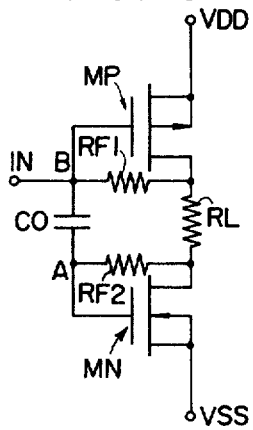
FIG. 3 is a circuit diagram of another CMOS amplifier used in the present invention.
Figure 4:
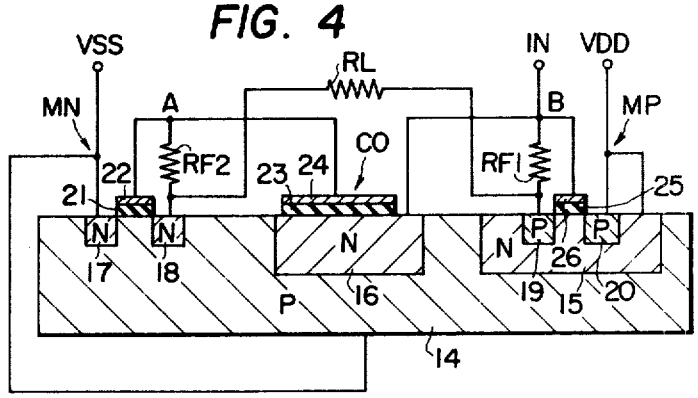
FIG. 4 is a sectional view of an essential part of a semiconductor integrated circuit device of another embodiment of the invention, obtained by integrating the circuit as shown in FIG. 3, FIG. 5 and FIG. 6 are circuit diagrams of an equivalent circuit to the semiconductor integrated circuit device as shown in FIG. 2, for explaining the latter.

In the foregoing embodiment, the substrate 1 is of N conductivity type. However, it is possible to compose the CMOS amplifier by a P type semiconductor substrate 14. In such a case, the circuit arrangement and the integrated circuit device are as shown in FIGS. 3 and 4, as will be easily understood by those skilled in the art.

More specifically, an N type well 16 which constitutes the first electrode of the capacitor CO is connected to the gate electrode 26 of a P-channel MOSFET formed on the N type well 15, while the second electrode 24 of the capacitor CO is connected to the gate electrode 22 of MOSFET MN of N-channel type which is formed directly on the P-type substrate 14, i.e. the gate electrode 22 of the N-type MOSFET MN whose second electrode is constituted by the substrate 14, whereas the input signal is applied to a junction point of the gate of the MOSFET MP and the N type well 16. In FIG. 4, as is the case of FIG. 2, reference numerals 17 and 18 denote N-type source and drain regions of MOSFET MN, while numerals 19 and 20 denote P type drain and source regions of the MOSFET MP, respectively. Also, numerals 21, 23 and 25 denote thin insulating films made of silicon oxides or the like insulating material, while numerals 22, 24 and 26 denote conductive layers made of aluminum or a polysilicon.

FIG. 8 shows an example of a circuit of an oscillation circuit making use of the amplifier circuit in accordance with the invention. In this oscillation circuit, a P-channel FET MP provided at the high-voltage side source terminal VDD is connected to the n-channel type FET MN provided at the low-voltage side source terminal VSS, through load resistances RL1 and RL2. At the same time, bias resistances RF1 and RF2 are connected between the sources and drains of the transistors FET MP and FET MN, respectively. The gates of both FETs are connected to each other through the DC current blocking capacitor CO, so as to complete the amplifier circuit.

At the same time, an oscillation circuit is constituted by a positive feedback circuit which consists of a quartz oscillator x provided between input and output sides of the amplifier and the capacitors CG and CD provided at the grounding side. Either one of source terminals VDD and VSS in FIG. 8 is grounded suitably.

The portion encircled by one-dot-and-dash line in FIG. 8 is integrated as shown in FIG. 9. More concretely, the above stated DC current blocking capacitor CO has a construction as shown in FIG. 10.

Figure 10:
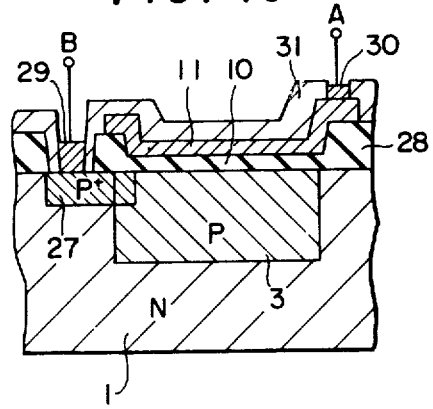

Namely, FIG. 10 shows in section an example of the capacitor usable as the DC current blocking capacitor CO. Referring to FIG. 10, one of the terminals of the capacitor CO is constituted by a P type well 3 formed in the n-type semiconductor substrate 1, while the other electrode is constituted by a gate region 11 formed on the P type well 3 through an interposed gate oxidation film 10, so as to make use of the gate capacitance existing between the P type well 3 and the gate region 11.

A $p^+$ type region 27 formed at the boundary surface section between the P type well 3 and the n type substrate 1 constitutes a lead for leading out the electrode of the well region, while numerals 28 and 31 designate a thick oxidation film and a protective oxidation film. Symbols A and B denote the electrode terminals.

The gate capacitance of this construction is connected such that, as shown in FIG. 9, the gate terminal A is connected to the gate of P-channel FET MP provided at the high-voltage source terminal side VDD, while the well region electrode terminal B is connected to the gate of n-channel FET MN provided at the low voltage source terminal side VSS.

This arrangement provides, for the same reason as stated before, an oscillation circuit having major parts mounted in a single semiconductor substrate and less affected by the parasitic capacitance CX.

When the quartz oscillation circuit as shown in FIG. 8 is incorporated in an electronic device such as an electronic wrist watch, it is necessary to connect capacitors represented by CG and CD, externally of the IC, for the purpose of fine adjustment of the oscillation frequency. The adjustable range of frequency afforded by these capacitors (capacitance being of about 20 PF order) is largely affected by the presence of the aforementioned parasitic capacitance. More specifically, the adjustable range is inconveniently narrowed as the parasitic capacitance grows large. This problem is not so serious in the described embodiment, since the parasitic capacitance is made small due to the connection of the well region 3 constituting the capacitor CO to the gate of MOSFET MN to which the input signal is applied. Similar advantage can be obtained by different forms of the capacitor CO adoptable in the semiconductor integrated circuit device of the invention, as will be described hereinafter.

Figure 11:
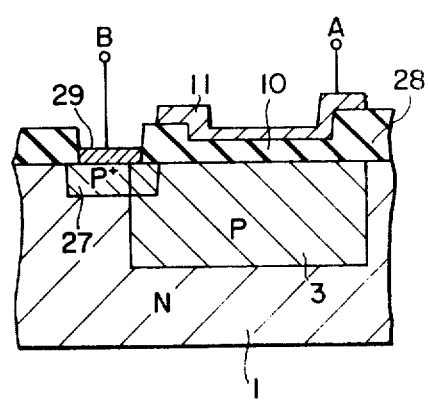

Referring to FIG. 11 showing in section another form of the DC current blocking capacitor CO, this capacitor is characterized in that the gate electrode 11 is formed on a polysilicon of the same conductivity type as the well region 3 (P type), although the major construction is substantially same as that of the capacitor as shown in FIG. 10. This arrangement affords a larger capacitance for the unit area of the gate capacitance Co, for the reason described hereinunder.

Figure 12:
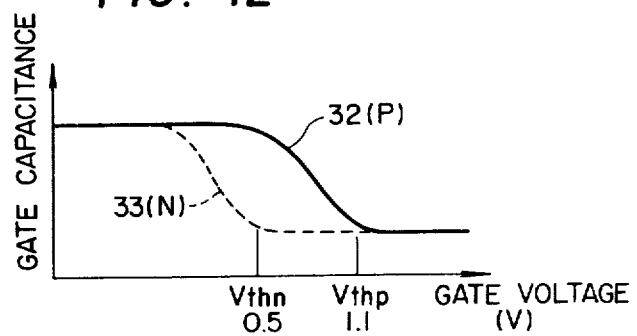
FIG. 12 shows a voltage-capacitance characteristic curve of the capacitor as shown in FIG. 11.

FIG. 12 shows, for the purpose of explaining the above mentioned reason, gate capacitance-gate voltage characteristics for each case of the gate electrodes constituted by n type polysilicon and p type polysilicon. As will be seen from the characteristic curves, the gate capacitance of the MOS capacitor is decreased from the maximum capacitance which is determined by the thickness of the gate insulating film, as the channel is formed on the well region beneath the gate insulating film.

Consequently, the minimum gate capacitance is obtained when the gate voltage is increased substantially to the level of the threshold voltage (Vthn, Vthp). The work function differential $\phi_F$ is reduced by substituting the P type silicon for the n type silicon, so as to shift the threshold voltage in the positive direction, i.e. from Vthn to Vthp, thereby to shift the capacitance characteristics. This shifted capacitance is substantially equal to 2 $\phi_E$ which corresponds to about 0.6 V. Thus, by constituting the gate electrode by p type polysilicon, the capacitor can be used at a region over which the reduction of the gate capacitance is relatively small, so that the capacitance per unit area can be selected large. Consequently, the area occupied by the capacitor can be decreased, so as to further diminish the parasitic capacitance residing between the capacitor and the n type substrate. The substitution of the p type silicon for the n type silicon can be made by ordinary CMOS manufacturing process without necessitating any complicated additional step.

Figure 13:
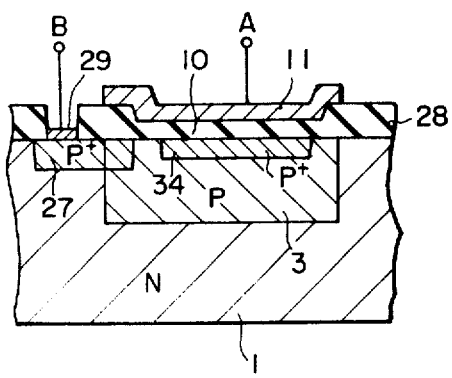
Figure 14:
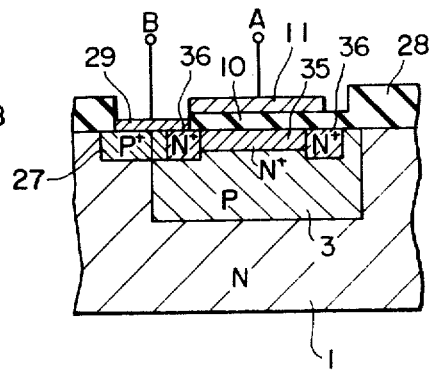

FIGS. 13 and 14 show still other forms of the DC current blocking capacitor CO.

Referring first to FIG. 13, p type impurities such as boron are driven from the upper side of the gate insulating film 10 of a construction as shown in FIG. 11 having a gate electrode made of a polysilicon, by ion-driving method, so as to form a region 34 of impurities of high concentration at the upper side of the P type well 3.

Turning now to FIG. 14, a gate capacitance is constituted by a P type well 3 formed in an n type substrate 1, a gate insulating film 10 formed on the P type well 3 and a gate electrode 11 having an area smaller than that of the P type well 3 and formed on the gate insulating film 10. In this capacitor, a region 35 of highly concentrated impurities of the conductivity type opposite to that of region 34 of FIG. 13, i.e. n+ type impurity region 35, is formed beneath the gate electrode 11, through driving n type impurities such as phosphorus by the ion-driving method.

In the capacitors as shown in FIGS. 13 and 14, the inverse layer is less likely to be formed beneath the gate because the concentration of impurities is specifically high at such a portion. Consequently, it becomes possible to make the capacitance larger for unit area, and the area can be made small accordingly, so as to reduce the parasitic capacitance residing between the n type substrate and the capacitor. At the same time, by restraining the formation of the inverse layer in the described manner, the capacitor becomes usable as a capacitor having no voltage dependency.

As has been described, according to the invention, the parasitic capacitance of the DC current blocking capacitor is conveniently reduced. Thus, an amplifier circuit or an oscillation circuit having small parasitic capacitance is obtained by an incorporation of such a capacitor.

Having described the invention through preferred embodiments, it is to be noted here that these embodiments are not exclusive, and various changes and modifications may be imparted thereof.

For instance, in the foregoing description of embodiments two ways of reducing the parasitic capacity have been explained: a direct reduction of the parasitic capacitance and an indirect reduction of the parasitic capacitance through increasing the gate capacitance per unit area. Although these ways have been explained separately, needless to say, both ways of reducing the parasitic capacitance may be suitably combined with each other, so as to ensure a larger effect in reducing the parasitic capacitance.

Although the description has been made specifically through illustration of a CMOS having P type well formed in the n type substrate, it will be understood by those skilled in the art that an inversed construction i.e. a construction having n type well formed in p type substrate, can be obtained by inverting the conductivity types of elements and polarity of the power source. Thus, in case of the example as shown in FIG. 11 in which the p type polysilicon is used for constituting the gate electrode in place of the n type polysilicon, the substitution has to be made in a reverse manner, i.e. the p type silicon gate is substituted by the n type silicon gate, if the well is of n type.

Further, the gate capacitor with a p type gate region as shown in FIG. 11, having a larger capacitance per unit area, can be used solely and independently as a capacitor having small voltage dependency.

Thus, the present invention can be applied widely to various amplifiers which suffers the problem attributable the parasitic capacitance.

What is claimed is:

1. An amplifier circuit having a p-channel type MISFET and an n-channel type MISFET which are integrated in a single semiconductor substrate, a load resistance connected between the drain regions of said MISFETs, a power source to which said MISFETs are connected in series, and a capacitance through which the gates of said MISFETs are connected to each other, characterized by comprising said capacitance having one terminal constituted by a well formed in said semiconductor substrate and another electrode constituted by a gate electrode formed on the surface of said well, said gate electrode and said semiconductor substrate being connected to the high voltage side of the power supply while said well is connected to the low voltage side of the power supply.

2. An amplifier circuit as set forth in claim 1, wherein said gate electrode is connected to the gate of one of said MISFET connected to the high voltage side of the power supply, while said well is connected to the gate of the other MISFET connected to the low voltage side of the power supply.

3. An amplifier circuit according to claim 1, wherein the capacitance is formed in the substrate between the MISFETs.

4. A semiconductor integrated circuit comprising a semiconductor body having a major surface of a first conductivity type, a first and a second semiconductor region of the second conductivity type formed in the major surface of said body, a first conductivity type MIS transistor formed at the surface of said first region, a second conductivity type MIS transistor formed at the major surface of said body separated from the first and second regions, an insulating film formed on the surface of said second region, a conductive layer formed on the insulating film, means for connecting said second region to the gate electrode of said first conductivity type MIS transistor, and means for connecting said conductive layer to the gate electrode of said second conductivity type MIS transistor, so as to couple both gate electrodes with a capacitor, wherein said first region and said semiconductor body are respectively connected to first and second power source terminals coupled to first and second potentials, respectively, for energizing said first and second conducitivity type MIS transistors to back bias the junction formed between the second region and the semiconductor body to reduce the parasitic capacitance between the second region and the semiconductor body.

5. A semiconductor integrated circuit as set forth in claim 3, said first and second conductivity type MIS transistors are p-channel and n-channel MIS transistors, respectively.

6. A semiconductor integrated circuit according to claim 4, wherein the first conductivity type is N-type, the second conductivity type is P-type, and the second potential coupled to the second conductivity type MIS transistor is the high voltage side of a power source which high voltage side is greater than the first potential.

7. A semiconductor integrated circuit according to claim 4, wherein the first conductivity type is P-type, the second conductivity type is N-type, and the first potential coupled to the first conductivity type MIS transistor is the high voltage side of a power source which high voltage side is greater than the second potential.

8. A semiconductor integrated circuit according to claim 4, wherein said second region is formed in the semiconductor body between the MIS transistors.

9. A semiconductor integrated circuit according to claim 3, wherein the first conductivity type MIS includes a source and a drain region of the first conductivity type formed in the surface of the first region, the second conductivity type MIS includes a source and a drain region of the second conductivity type formed in the major surface of the semiconductor body, and further comprising means for connecting the drain region of said first conductivity type MIS transistor to the drain region of said second conductivity type MIS transistor, a first power source terminal connected to said first region and said source region formed in the first region to supply a first potential to said first region, a second power source terminal connected to said semiconductor body and said source region formed in the body to supply a second potential to said semiconductor body and the source region of the second conductivity type MIS transistor, first bias means for providing a first bias voltage between the gate electrode and source region of said first conductivity type MIS transistor, and second bias means for providing a second bias voltage between the gate electrode and source region of said second conductivity type MIS transistor, whereby the junction formed between said second region and said semiconductor body is back-baised by a potential difference between the second potential and a potential at gate electrode of said first conductivity type MIS transistor so as to reduce the parasitic capacitance of said junction.

* * * * *